(12) United States Patent
Luo et al.

(10) Patent No.: US 9,280,925 B2
(45) Date of Patent: Mar. 8, 2016

(54) METHOD FOR POWER-ON SEQUENCE AND DEVICE WITH LOW CURRENT POWER SOURCE

(71) Applicant: Generalplus Technology Inc., Hsinchu (TW)

(72) Inventors: Shih-Ming Luo, Taichung (TW); Ming-Hung Tsai, Feng Shan (TW)

(73) Assignee: GENERALPLUS TECHNOLOGY INC., Hsinchu (TW)

( * ) Notice: Subject to any disclaimer, the term of this patent is extended or adjusted under 35 U.S.C. 154(b) by 102 days.

(21) Appl. No.: 14/154,911

(22) Filed: Jan. 14, 2014

(65) Prior Publication Data
US 2015/0022511 A1   Jan. 22, 2015

(30) Foreign Application Priority Data

Jul. 17, 2013 (TW) .............................. 102125484 A

(51) Int. Cl.
| | |
|---|---|
| G06F 3/038 | (2013.01) |
| G09G 5/00 | (2006.01) |
| G09G 3/20 | (2006.01) |
| G06F 1/26 | (2006.01) |
| H02J 1/00 | (2006.01) |
| H03K 17/22 | (2006.01) |
| H03K 19/003 | (2006.01) |

(52) U.S. Cl.
CPC ................ *G09G 3/2092* (2013.01); *G06F 1/26* (2013.01); *H02J 1/00* (2013.01); *H03K 17/22* (2013.01); *H03K 19/00346* (2013.01)

(58) Field of Classification Search
CPC .................................................... G09G 3/2092
See application file for complete search history.

(56) References Cited

U.S. PATENT DOCUMENTS

| 5,986,649 A * | 11/1999 | Yamazaki | ............ G09G 3/3696 345/211 |
|---|---|---|---|
| 2012/0268441 A1* | 10/2012 | Watanabe | ............ G09G 3/3648 345/211 |

* cited by examiner

*Primary Examiner* — Charles Hicks
(74) *Attorney, Agent, or Firm* — Muncy, Geissler, Olds & Lowe PC

(57) ABSTRACT

A method for power-on sequence and a device with a low current power source are provided in the present invention. The method is used for enabling a device including a low current power source, a first circuit module and a second circuit module, wherein the low current power source is used for providing a power voltage. The method includes: switching a low voltage reset signal from a first logic voltage to a second logic voltage when the power voltage rise to a threshold voltage; enabling the first circuit module after a first preset time from the time when the low voltage reset signal switches from the first logic voltage to the second logic voltage; and enabling the second circuit module after a second preset time from the time when the first circuit module is enabled.

9 Claims, 5 Drawing Sheets

METHOD FOR POWER-ON SEQUENCE AND DEVICE WITH LOW CURRENT POWER SOURCE

This application claims priority of No. 102125484 filed in Taiwan R.O.C. on Jul. 17, 2013 under 35 USC 119, the entire content of which is hereby incorporated by reference.

BACKGROUND OF THE INVENTION

1. Field of the Invention

The invention relates to an application for low current consumption, and more particularly to a method for power-on sequence and a device with low current power source.

2. Related Art

With the progress of the technology, the electronic technology has been progressed from the earliest vacuum tube and transistor to the integrated circuit chip, which has the quite wide applications. Thus, the electronic products have gradually become the indispensable essentials in the life of the modern human beings. Today, the global environment was severely damaged. More and more People concern about the environmental protection, and more products around us gradually began to move closer to the environmental protection. The electrical product with solar cell is widely adopted by people, such as solar calculator, LED lamp with solar power and so on.

FIG. 1 illustrates a circuit block diagram depicting a solar-powered product according to the conventional art. Referring to FIG. 1, the product includes a solar cell 101, a capacitor 102, a reset circuit 103, an enable circuit 104 and a multi-functional block 105. Generally speaking, when the solar cell 101 receives the sun light, the charges would store in the capacitor 102. When the voltage of the capacitor 102 is greater than a threshold voltage VT, the reset circuit 103 would perform power-on reset (FOR). In addition, the enable circuit 104 would enable the multi-functional block 105 to start the solar-powered product up.

FIG. 2 illustrates a waveform diagram depicting the operation of the solar-powered product in FIG. 1 according to the conventional art. Referring to FIG. 2, when the power-on reset signal LVRB converts from the logic low voltage to the logic high voltage, every function block 105 would be started up at the same time. However, some function blocks 105 require higher start-up current, such as charge pump, voltage regulator, etc. Moreover, for the application in low power consumption, such as product with solar lower than 50 lux, the solar cell 101 only can provide a constant current about 5 uA. The power voltage VDD may drops too quick because of the great current consumption according to the operation of the function blocks at the same time, such that the low voltage reset is triggered. Meanwhile, the function blocks are disabled. When the voltage again is greater than the threshold voltage VT, the power-on reset signal LVRB converts from the logic low voltage to the logic high voltage again. Then, every function block 105 would be started up at the same time. And, it causes that the low voltage reset is triggered because of the high voltage drop of the power voltage VDD. Therefore, the solar-powered product would be lockout as the abovementioned cycle.

In order to solve the abovementioned issue, the engineer would greatly increase the capacitance of the capacitor 102, such as 20 uF. Although, the abovementioned cycle may be solved, the start-up time would be too long (about 10 seconds) since the current supplying capability is only 5 uA. End user would hardly accept long start-up time of the solar-powered product.

SUMMARY OF THE INVENTION

In view of the above-identified problems, it is therefore an object of the invention to provide a method for power-on sequence and a device with low current power source such that the device with low current power source can rapidly and successfully start-up.

To achieve the above-identified object, the invention provides a method for power-on sequence. The method is used for enabling an apparatus, wherein the apparatus includes a low current power source, a first circuit module and a second circuit module, wherein the low current power source is used for providing a power voltage. The method includes the steps of: converting a voltage of a low voltage reset signal from a first logic voltage to a second logic voltage when the power voltage reaches a threshold voltage;

enabling the first circuit module after a first preset period from a time when the voltage of the low voltage reset signal from the first logic voltage to the second logic voltage; and enabling the second circuit module after a second period from a time when the first circuit module is enabled.

A device with low current power source is provided. The device includes a low current power source, a low voltage reset circuit, a first circuit module, a second circuit module and a sequential enabling circuit. The low current power source is used for providing a power voltage. The low voltage reset circuit is coupled to the low current power source to receive the power voltage, for converting a low voltage reset signal from a first logic voltage to a second logic voltage when the power voltage rise to a threshold voltage. The first circuit module starts operating when a first enable signal received by the enable terminal of the first circuit module is enabled. The second circuit module starts operating when a second enable signal received by the enable terminal of the second circuit module is enabled. The sequential enabling circuit is coupled to the first circuit module and the second circuit module. The sequential enabling circuit enables the first enable signal when the low voltage reset signal is from the first logic voltage to the second logic voltage after a first preset period, the sequential enabling circuit enables the second enable signal when the first enable signal is enable after a second preset period.

According to a preferred embodiment of the present invention, the the first circuit module includes a sample and hold circuit, receiving the power voltage, wherein the sample and hold circuit starts operating when the first enable signal received by an enable terminal of the sample and hold circuit. In a preferred embodiment of the present invention, the device further includes a microprocessor. The microprocessor starts operating when a power OK signal received by the enable terminal of the microprocessor.

According to a preferred embodiment of the present invention, the device with low current power source further includes a oscillator circuit. The oscillator circuit starts generating a clock signal required by the device with low current power source when the low voltage reset signal is from the first logic voltage to the second logic voltage. In a preferred embodiment, the second circuit module includes a power conversion circuit and a display circuit.

The power conversion circuit starts operating when the second enable signal received by the enable terminal of the power conversion circuit, wherein the power conversion circuit is used for boosting the power voltage to a display voltage. The display circuit receives the display voltage to perform displaying. Moreover, in a preferred embodiment, the power conversion circuit is a charge pump. The power conversion circuit enables a power OK signal when the display voltage outputting from the power conversion circuit reaches a sufficient voltage for the display circuit, wherein a microprocessor is enabled when the power OK signal is enabled. The charge pump operates at a first frequency before the power OK signal is enabled, the charge pump operates at a second frequency after the power OK signal is enabled. The second frequency is greater than the first frequency. Furthermore, in another preferred embodiment, the low current power source includes a solar cell and a capacitor. The solar cell is used for converting a received luminous beam into a solar power. The capacitor is used for storing the solar power, wherein a voltage between two terminals of the capacitor is the power voltage.

The spirit of the present invention is to utilize time division multiplexing to start up each different circuit with different power consumptions, instead of increasing the capability of the energy storage element. Therefore, Not only can the size of the product be reduced, but the start-up time would be increased. Moreover, the start-up malfunction would be solved.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
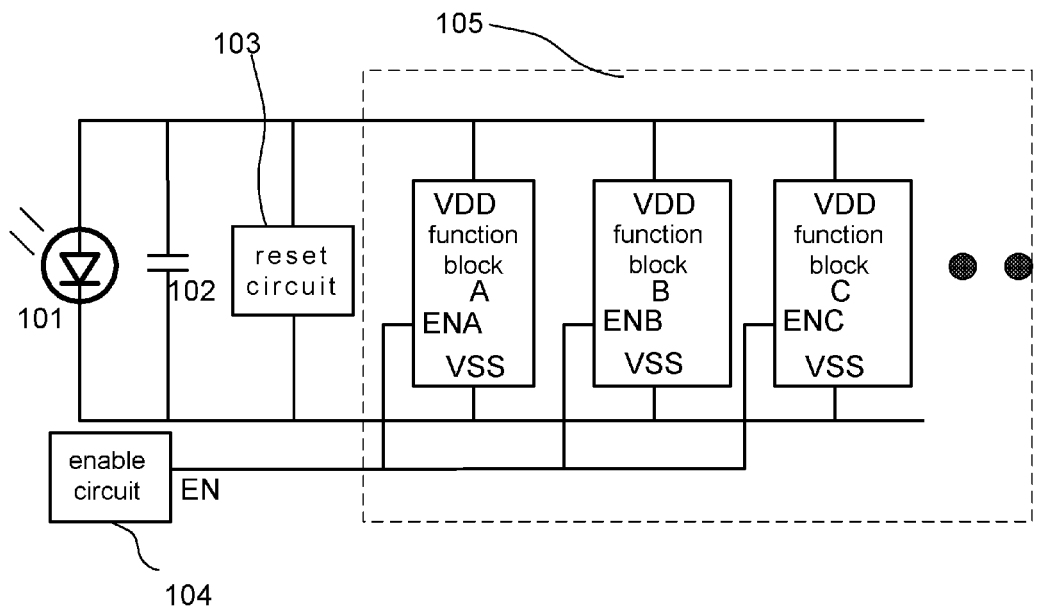
FIG. 1 illustrates a circuit block diagram depicting a solar-powered product according to the conventional art.
Figure 2:
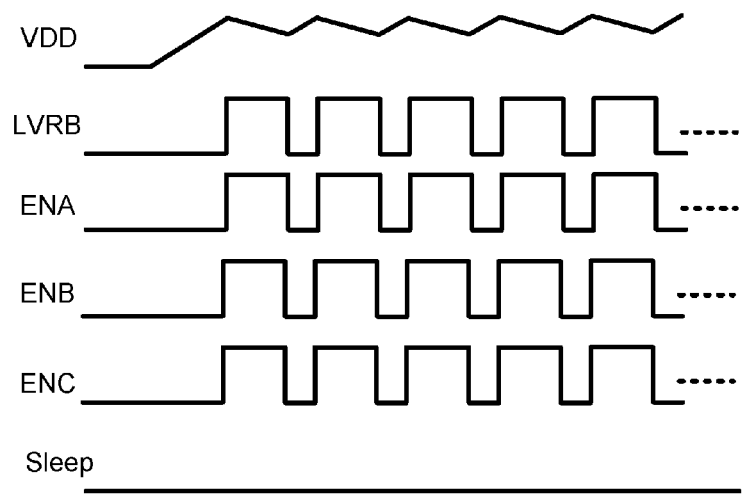
FIG. 2 illustrates a waveform diagram depicting the operation of the solar-powered product in FIG. 1 according to the conventional art
Figure 3:
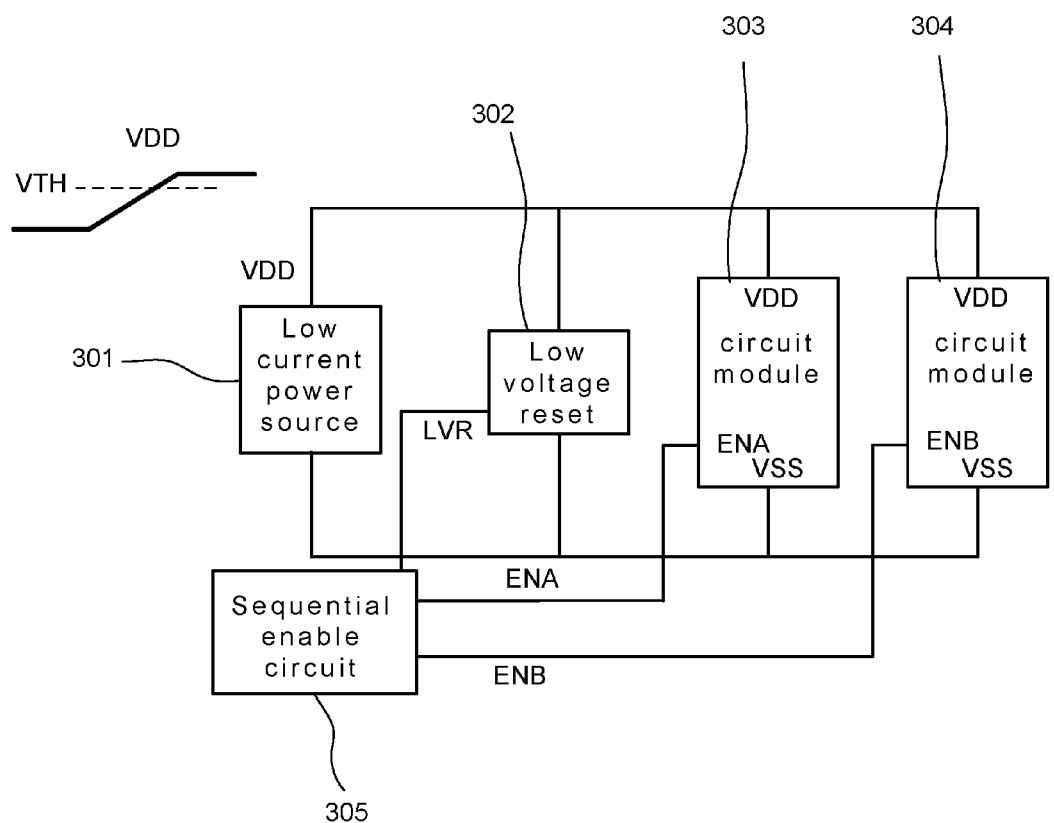
FIG. 3 illustrates a circuit block diagram depicting a device with low current power source according to a preferred embodiment of the present invention.

FIG. 3 illustrates a circuit block diagram depicting a device with low current power source according to a preferred embodiment of the present invention. Referring to FIG. 3, the device with low current power source includes a low current power source 301, a low voltage reset circuit 302, a first circuit module 303, a second circuit module 304 and a sequential enable circuit 305. The low current power source is used for providing a power voltage VDD. The low voltage reset circuit 302 receives the power voltage. When the power voltage VDD rise to a threshold voltage VTH, the low voltage reset signal LVR is converted from the logic low voltage to the logic high voltage. The first circuit module 303 and the second circuit module 304 respectively include an enable terminal EN. The enable terminals of the first circuit module 303 and the second circuit module 304 are coupled to the sequential enable circuit 305.

Generally speaking, the low current power source 301 has low power-supplying capability. If the first circuit module 303 and the second circuit module 304 is started up at the same time, the start-up malfunction as the description on the prior art would occur. Therefore, in this embodiment, the phase-divided start-up is adopted for initializing the device. First, the low voltage reset signal LVR outputted by the low voltage reset circuit 302 would keep in the logic low voltage. When the power voltage VDD outputted by the low current power source 301 reaches the threshold voltage VTH, the low voltage reset circuit 302 converts the low voltage reset signal LVR from the logic low voltage to the logic high voltage to release the low voltage reset state.

Afterward, the sequential enable circuit 305 is started up, and then the first enable signal ENA is enabled after a first preset period. When the first enable signal ENA is enabled, the first circuit module 303 is started up. After a second preset period from the time when the first enable signal ENA is enabled, the second enable signal ENB is enabled. When the second enable signal ENB is enabled, the second circuit module 304 is started up.

According to the abovementioned embodiment, people having ordinary skill in the art should know that the device may be lockout if the first circuit module 303 and the second circuit module 304 are started up at the same time because of the insufficient driving capability of the low current power source. Thus, in the present embodiment of the present invention, the phase-divided start-up is adopted, such that the start-up malfunction is prevented. In order to easy and further understand the spirit of the present invention by people having ordinary skill in the art, a solar-powered device is adopted for example.

Figure 4:
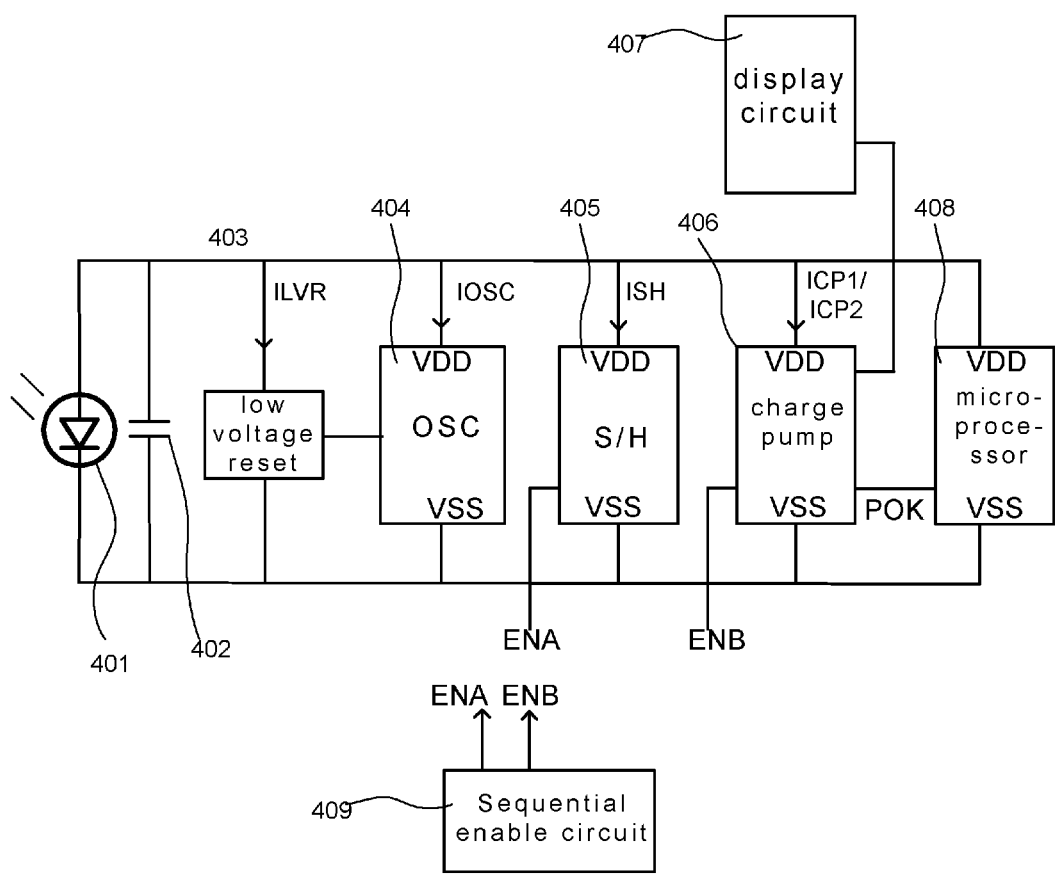
FIG. 4 illustrates a circuit block diagram depicting a solar-powered device according to a preferred embodiment of the present invention.
Figure 5:
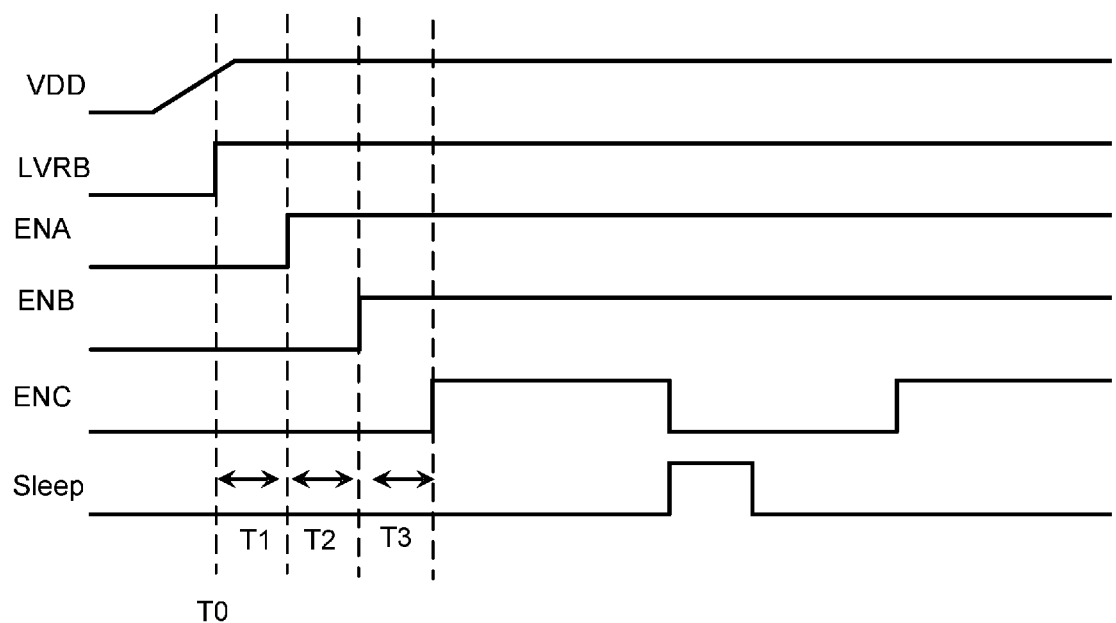
FIG. 5 illustrates a waveform diagram depicting the operation of the solar-powered device according to a preferred embodiment of the present invention.

FIG. 4 illustrates a circuit block diagram depicting a solar-powered device according to a preferred embodiment of the present invention. Referring to FIG. 4, the solar-powered device includes a solar cell 401, a capacitor 402, a low voltage reset circuit 403, an oscillator 404, a sample-and-hold circuit 405, a charge pump 406, a display circuit 407, a microprocessor 408 and a sequential enable circuit 409. FIG. 5 illustrates a waveform diagram depicting the operation of the solar-powered device according to a preferred embodiment of the present invention. Referring to FIG. 4 and FIG. 5, in this embodiment, it is assumed that the solar cell 401 receives 50 lux. Thus, the solar cell 401 would outputs 5 uA to the capacitor 402 to store the charge. The voltage VDD between two terminals of the capacitor 402 would linearly rise. When the power voltage VDD reaches the threshold voltage VTH, the low voltage reset circuit 403 converts the low voltage reset signal LVR from the logic low voltage to the logic high voltage. At this time, the solar-powered device is released from the low voltage reset state.

Next, since the low voltage reset signal LVR is converted from the logic low voltage to the logic high voltage at the time T0, the oscillator 404 is started up to provide the clock signal required by the solar-powered device. In addition, after a first preset period T1 from the time when the low voltage reset signal LVR is converted from the logic low voltage to the logic high voltage, the sequential enable circuit 409 enables the first enable signal ENA. At this time, the sample-and-hold circuit 405 is started up. After a second preset period T2 from the time when the sample-and-hold circuit 405 is started up, the sequential enable circuit 409 enables the second enable signal ENB. Meanwhile, the charge pump 406 is started up. After a third preset period T3 from the time when the charge pump 406 is started up, the charge pump 406 enables the power Ok signal (POK). At this time, the microprocessor 408 is started up.

The abovementioned periods T1, T2 and T3 can be determined by the current consumption of those circuits. For example, the current consumption of the low voltage reset circuit 403 is represented as ILVR; the current consumption of the oscillator 404 is represented as IOSC; the current consumption of the sample-and-hold circuit 405 is represented as ISH; the current consumption of the charge pump 406 in initial operation with half of the original frequency is represented as ICP1. When the output voltage of the charge pump 406 reaches the double power voltage VDD which is sufficient to supply the display voltage of the display circuit 407, and outputs a power OK signal (POK), the microprocessor 408 controls the charge pump 406 to operates at original frequency, and the current consumption of the charge pump 406 is represented as ICP2.

According to the description, the main power consumption of the solar-powered device is the initialized phase T2 of the charge pump 406. Thus, designer must calculates the power voltage VDD generates by the solar cell can safely maintain the voltage higher than a threshold for the period T2. In addition, it is assumed that the capacitance of the capacitor 402 is 10 uF. Further, it is assumed that the output voltage of the charge pump 406 reaching the double power voltage needs 50 ms. According to the function Ix t=C×V, the voltage drop of the power voltage VDD can be calculated as:

$$(ICP1-5 u) \times 50 \text{ ms} = V \times 10 \text{ uF}$$

$$Vd = (ICP1-5 u) \times 50 \text{ ms}/10 \text{ uF}$$

In order to compensate the voltage drop Vd, in the previous two phases T1 and T2, the voltage must raise at least Vd. Also, in order to conveniently calculate, it is assumed that the period T1 is equal to the period T2, and represented as Tr. Substituting it into the formula, it obtains:

$$(5 u - ILVR - IOSC) \times Tr + (5 u - ILVR - IOSC - ISH) \times Tr = Vd \times 10 \text{ uF}$$

$$Tr = (10 u - 2ILVR - 2IOSC - 1SH)/Vd \times 10 \text{ uF}$$

Thus, the periods T1 and T2 respective need at least abovementioned time Tr. Therefore, designer can design the circuit by referring to the abovementioned calculation of the capacitor charge and discharge.

In this embodiment, the capacitance of the capacitor 402 is unnecessary. Thus, the cost thereof and the size of product can be reduced, and the start-up speed would be increased.

Figure 6:
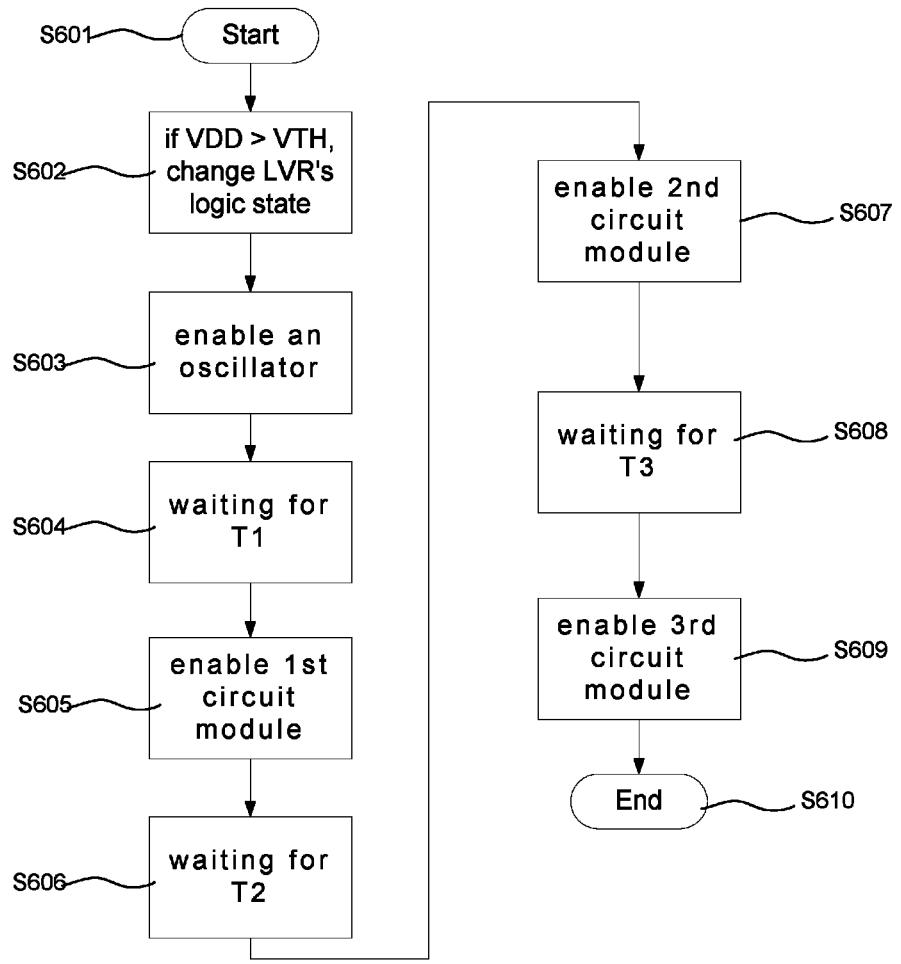
FIG. 6 illustrates a flowchart depicting the method for power-on sequence according to a preferred embodiment of the present invention.

According to the abovementioned embodiments, it can be summarized as a method for power-on sequence. FIG. 6 illustrates a flowchart depicting the method for power-on sequence according to a preferred embodiment of the present invention. Referring to FIG. 6, the method for power-on sequence includes the steps as follow.

In step S601, the method starts.

In step S602, when the power voltage VDD reaches a threshold voltage VTH, the voltage of the low voltage reset signal LVR is converted from the first logic voltage to the second logic voltage.

In step S603, an oscillator is started-up to generate a required clock signal.

In step S604, waiting for a first preset period T1.

In step S605, the first circuit module is enabled. For example, the sample-and-hold circuit 405 is enabled.

In step S606, waiting for a second preset period T2,

In step S607, the second circuit module is enabled. For example, the charge pump 406 and the display circuit 407 is enabled. In this embodiment, the charge pump operates at low frequency, and the operation frequency is reduce to half of the original frequency.

In step S608, waiting for a third preset period T3.

In step S609, the third circuit module is enabled, For example, the microprocessor 408 is enabled. At this time, the microprocessor 408 can determine whether the output voltage of the charge pump 406 is greater than the double power voltage VDD. If the output voltage of the charge pump 406 is greater than the double power voltage VDD, the power OK signal is enabled such that the operation frequency of the charge pump comes back to the original frequency.

In step S610, the method ends.

In summary, the spirit of the present invention is to utilize time division multiplexing to start up each different circuit with different power consumptions, instead of increasing the capability of the energy storage element. Therefore, Not only can the size of the product be reduced, but the start-up time would be increased. Moreover, the start-up malfunction would be solved.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A device with low current power source, comprising:
    a low current power source, for providing a power voltage;
    a low voltage reset circuit, coupled to the low current power source, receiving the power voltage, for converting a low voltage reset signal from a first logic voltage to a second logic voltage when the power voltage rises to a threshold voltage;
    a first circuit module, comprising an enable terminal, wherein the first circuit module starts operating when a first enable signal received by the enable terminal of the first circuit module is enabled;
    a second circuit module, comprising an enable terminal, wherein the second circuit module starts operating when a second enable signal received by the enable terminal of the second circuit module is enabled; and
    a sequential enabling circuit, coupled to the first circuit module and the second circuit module, wherein the sequential enabling circuit enables the first enable signal when the low voltage reset signal changes from the first logic voltage to the second logic voltage after a first preset period, and the sequential enabling circuit enables the second enable signal when the first enable signal is enabled after a second preset period.

2. The device with low current power source according to claim 1, wherein the first circuit module comprises:
    a sample and hold circuit, receiving the power voltage, wherein the sample and hold circuit starts operating when the first enable signal is received by an enable terminal of the sample and hold circuit.

3. The device with low current power source according to claim 1, further comprising:
an oscillator circuit, coupled to the low voltage reset circuit, receiving the low voltage reset signal, wherein the oscillator circuit starts generating a clock signal required by the device with the low current power source when the low voltage reset signal changes from the first logic voltage to the second logic voltage.

4. The device with low current power source according to claim 1, wherein the second circuit module comprises:
a power conversion circuit, comprising an enable terminal, receiving the power voltage, wherein the power conversion circuit starts operating when the second enable signal is received by the enable terminal of the power conversion circuit, wherein the power conversion circuit is used for boosting the power voltage to a display voltage;
a display circuit, coupled to the power conversion circuit, receiving the display voltage to perform displaying.

5. The device with low current power source according to claim 4, wherein the power conversion circuit is a charge pump,
wherein, the power conversion circuit enables a power OK signal when the display voltage output from the power conversion circuit reaches a sufficient voltage for the display circuit, wherein a microprocessor is enabled when the power OK signal is enabled,
wherein the charge pump operates at a first frequency before the power OK signal is enabled, the charge pump operates at a second frequency after the power OK signal is enabled,
wherein the second frequency is greater than the first frequency.

6. The device with low current power source according to claim 1, wherein the low current power source comprises:
a solar cell, for converting a received luminous beam into a solar power; and
a capacitor, coupled to the solar cell, for storing the solar power, wherein a voltage between two terminals of the capacitor is the power voltage.

7. A method for power-on sequence, for enabling an apparatus, wherein the apparatus includes a low current power source, a first circuit module and a second circuit module, wherein the low current power source is used for providing a power voltage, the method comprising:
converting a voltage of a low voltage reset signal from a first logic voltage to a second logic voltage when the power voltage reaches a threshold voltage;
after the voltage of the low voltage reset signal is converted from the first logic voltage to the second logic voltage, and following a first preset period, enabling the first circuit module; and
after the first circuit module is enabled, and following a second preset period, enabling the second circuit module.

8. The method for power-on sequence according to claim 7, further comprising:
enabling an oscillator circuit to generate a required clock signal when the voltage of the low voltage reset signal is converted from the first logic voltage to the second logic voltage.

9. The method for power-on sequence according to claim 7, wherein the second circuit module is a charge pump and a display circuit, wherein the display circuit receives a display voltage output from the charge pump, and the method further comprises:
operating the charge pump at a first frequency when the charge pump starts operating;
enabling a microprocessor after a third preset period from a time when the charge pump starts operating;
determining whether the display voltage output from the charge pump reaches a sufficient voltage for the display circuit;
enabling a power OK signal when the display voltage is greater than the sufficient voltage for the display circuit; and
operating the charge pump at a second frequency after the power OK signal is enabled,
wherein the second frequency is greater than the first frequency.

* * * * *